(12) United States Patent
Hardy et al.

(10) Patent No.: US 8,208,878 B1
(45) Date of Patent: Jun. 26, 2012

(54) AMPLIFIER PROVIDING POWER RECOVERY FROM A NARROW-BAND ANTENNA

(75) Inventors: Tim Hardy, Ferguson's Cove (CA); Dennis Covill, Hackett's Cove (CA)

(73) Assignee: Nautel Limited, Hackett's Cove, Nova Scotia (CA)

( * ) Notice: Subject to any disclaimer, the term of this patent is extended or adjusted under 35 U.S.C. 154(b) by 0 days.

(21) Appl. No.: 13/412,621

(22) Filed: Mar. 6, 2012

Related U.S. Application Data

(62) Division of application No. 12/470,210, filed on May 21, 2009, now Pat. No. 8,140,035.

(60) Provisional application No. 61/054,836, filed on May 21, 2008, provisional application No. 61/054,831, filed on May 21, 2008.

(51) Int. Cl.
*H01Q 11/12* (2006.01)
*H04B 1/04* (2006.01)

(52) U.S. Cl. ............... 455/127.5; 455/573; 455/574; 330/296; 330/297

(58) Field of Classification Search ............ 455/572, 455/573, 574, 127.1, 127.5; 330/296, 297, 330/199
See application file for complete search history.

(56) References Cited

U.S. PATENT DOCUMENTS

| | | | |
|---|---|---|---|
| 4,580,111 A | | 4/1986 | Swanson |
| 5,220,290 A | * | 6/1993 | Black .......................... 330/279 |
| 5,574,967 A | * | 11/1996 | Dent et al. ................. 455/12.1 |
| 6,294,957 B1 | | 9/2001 | Luu |
| 8,140,035 B2 | | 3/2012 | Hardy et al. |
| 2003/0214435 A1 | | 11/2003 | Johannessen et al. |
| 2006/0214649 A1 | * | 9/2006 | Herzinger et al. ........... 323/282 |

* cited by examiner

*Primary Examiner* — Nguyen Vo
(74) *Attorney, Agent, or Firm* — Vincent K. Gustafson; Jenkins, Wilson, Taylor & Hunt, P.A.

(57) ABSTRACT

A method, amplifier and system are provided for enabling power recovery from a narrow-band antenna when a signal having bandwidth exceeding that of the antenna is utilized. The amplifier provides amplification of a source signal to the antenna and recovery of power stored in the antenna during periods when the impedance of the antenna is negative to enable reverse current through the amplifier to a direct current (DC) power source.

10 Claims, 11 Drawing Sheets

AMPLIFIER PROVIDING POWER RECOVERY FROM A NARROW-BAND ANTENNA

CROSS-REFERENCE TO RELATED APPLICATIONS

This application is a divisional of U.S. patent application Ser. No. 12/470,210 filed on May 21, 2009 and issued as U.S. Pat. No. 8,140,035 on Mar. 20, 2012, which further claims benefit of U.S. Provisional Patent Application No. 61/054,831 filed on May 21, 2008 and U.S. Provisional Patent Application No. 61/054,836 filed on May 21, 2008. The disclosure of each foregoing patent application is hereby incorporated herein in its entirety, for all purposes.

TECHNICAL FIELD

The invention relates to radio frequency signal transmission amplifiers. More specifically, it relates to amplifiers in transmitters where the antenna has a relatively short electrical length compared to the transmitted wavelength.

BACKGROUND

In recent years, traditional radio-navigational systems, such as Loran (long range navigation), have been slowly replaced or relegated to a backup role for more accurate satellite navigational systems, such as GPS (global positioning system). However, complete replacement of radio-navigational systems with GPS has not occurred thus far, due to some of the shortcomings of GPS.

In fact, there has been a renewed interest in systems such as Loran to provide backup for GPS systems, in the event of failure of the GPS systems. Accordingly, Loran systems are being studied to determine whether they can be updated to provide a reliable backup system for GPS.

Loran antennas used in most transmission sites are characterized by having relatively short electrical lengths compared to the transmitted wavelength. The antenna, highly capacitive due to the short electrical length, is normally series resonated with a loading inductor to minimize the reactance at the center frequency.

The resulting tuned circuit has a very narrow bandwidth with a quality factor (Q) typically in the range of 20 to 60.

The ideal transmitted Loran signal has a bandwidth that considerably exceeds the bandwidth of the transmission antenna. It is normally a requirement for any transmitter system that the bandwidth of the antenna exceeds the bandwidth of the transmitted signal. In the case of Loran, the antenna bandwidth deficit makes the antenna unsuitable for a typical transmitter, such as a Long Wave or Medium Wave Amplitude Modulation (AM) simply modified for operation at 100 kHz.

AM broadcasting transmitters are designed to operate into constant impedance, typically 50 ohms. The concept of impedance implies a steady state relationship between the voltages and currents in the amplifiers and the antenna. With Loran, no such steady state relationship exists. The instantaneous impedance of the antenna (the ratio of voltage to current at one instant in time) varies throughout the pulse from a very large level initially to close to the steady state base impedance near the pulse peak, then decreasing and finally becoming negative during the pulse tail. When the impedance is negative, power is flowing out of the antenna back to the transmitter. The negative power flow necessitates the use of "tail biter" circuitry, currently in use in Loran transmitters.

Typical amplifiers are designed for operation when the load is thought of as a resistor meaning that the signal bandwidth is less than the antenna bandwidth and the induced current waveform directly follows the voltage waveform. AM broadcast transmitters use passive LC impedance matching and combining circuitry to match the antenna impedance to the optimum load impedance for the radio frequency amplifiers. As a result of the considerable change in the antenna impedance during the Loran pulse, passive LC impedance matching networks are not ideal for this situation.

Accordingly, there is a need to develop a more efficient amplifier that can be used to transmit a signal that is larger than the bandwidth of a narrow-band antenna.

BRIEF DESCRIPTION OF THE DRAWINGS

Further features, aspects, and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
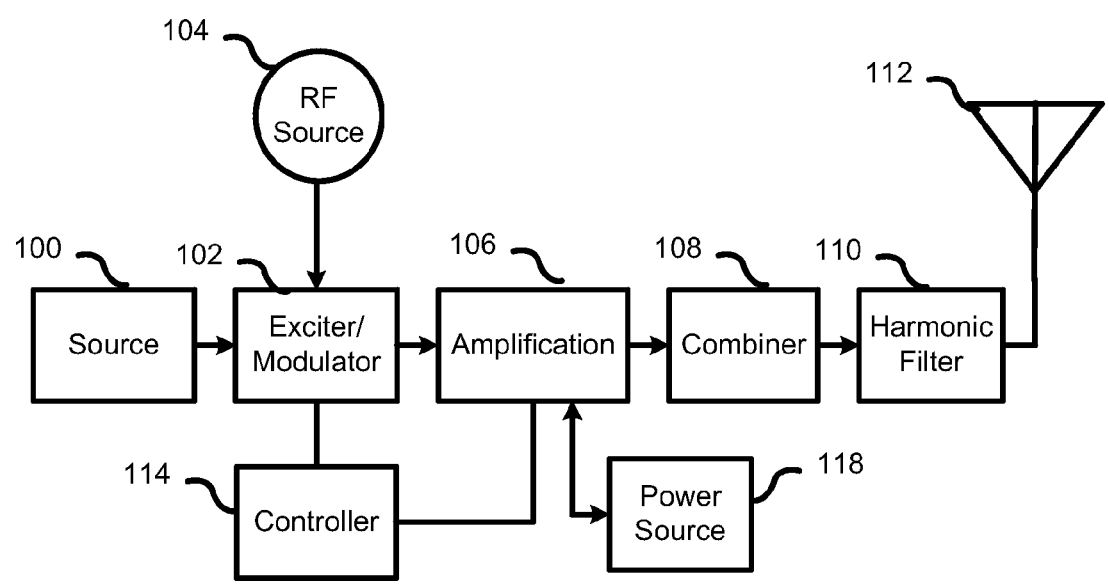
FIG. 1 is a representation of a radio frequency transmitter.

The present disclosure provides an amplitude modulated amplifier for Loran signal transmission. Also disclosed is a system for Loran signal transmission using the amplitude modulated amplifier. Embodiments of the present invention are described below, by way of example only, with reference to FIGS. 1-9.

In accordance with an aspect of the disclosure there is provided a method for using an amplifier to recover stored power from an antenna having a short electrical length compared to a wavelength of a transmitted signal. The method includes the steps of: (A) determining an impedance state of the antenna receiving a source signal for transmission; (B) enabling an amplifier to operate in a driving state when the impedance state is positive to modulate the source signal going to the antenna; and (C) enabling the amplifier to operate in a damping state when the impedance state of the antenna is negative, wherein the damping state provides current from the antenna to charge a direct current (DC) power source from power stored in the antenna.

In accordance with an aspect of the disclosure there is provided an amplitude modulated amplifier for amplifying a radio frequency (RF) signal. The amplifier includes: (A) four selectably controllable transistors arranged to receive power from a direct current (DC) power supply to amplify the signal, the transistors configured in a bridge configuration with a first and a second transistor coupled between the DC power supply and an antenna having a short electrical length compared to a wavelength of a transmitted signal, and with a third and a fourth transistor coupled between the antenna and ground in an 'H' configuration, each transistor having a gate input to determine the state of the transistor between an on state and an off state; (B) four diodes each associated with one of the four transistors and forward biased from a source to a drain of each transistor, forming a bridge rectifier; and (C) drive logic for controlling each of the four transistors from an open state to a closed amplifying state based on external input, wherein the drive logic is selectable from a driving state to a damping state of the amplifier by switching transistors to recover power from the antenna when an impedance state of the antenna is negative, and to deliver the recovered power to the DC power supply.

In accordance with an aspect of the disclosure there is provided a system for transmitting radio frequency signals into an antenna having a short electrical length compared to the wavelength of a transmitted signal. The system includes: (A) a signal source providing a baseband source signal to be amplified and modulated before transmission; (B) an exciter module for up-converting the source signal based on a frequency of a received RF source; (C) an amplification module comprising one or more amplifier, each amplifier comprising: (i) four selectably controllable transistors arranged to receive power from a direct current (DC) power supply to amplify the up-converted source signal, the transistors configured in a bridge configuration with a first and a second transistor coupled between the DC power supply and an antenna, and a third and fourth transistors coupled between the antenna and ground in an 'H' configuration, each transistor having a gate input to determine the state of the transistor between an on state and an off state; (ii) four diodes each associated with one of the four transistors and forward biased from a source to a drain of each transistor, forming a bridge rectifier; and (iii) drive logic for controlling each of the four transistors from an open state to a closed amplifying state based on external input, wherein the drive logic is selectable from an active state to a damping state of the amplifier by switching transistors to recover power from the antenna when an impedance state of the antenna is negative, and to deliver the recovered power to the DC power supply; (D) a power source for delivering DC power to the amplification module or receiving and storing power from the amplification module; (E) an antenna coupled to the amplification module, the antenna having a highly capacitive characteristic wherein the signal wavelength is less than the antenna wavelength, wherein current is delivered from the amplification module to the antenna when in the driving state and impedance is positive, and current is received from the antenna and delivered to the DC power source in the damping state when impedance is negative; and (E) a controller coupled to or integrated with the exciter module, for controlling the operation of the one or more amplifiers via the drive logic, wherein a subset of the one or more amplifiers is switched between the driving state or damping state, wherein any remaining amplifier(s) of the one or more amplifiers are placed in an inactive mode, to control the modulation of the transmitted signal.

In very general terms, the present disclosure provides a modified amplitude modulated amplifier and associated system and method that is designed to accommodate and essentially capture energy flowing from a narrow-band antenna during the negative power flow phase of a signal such as in a Loran pulse.

A suitable transmitter, as shown in FIG. 1 includes an input source 100, an exciter/modulator 102, an RF source 104, a controller 114, one or more amplifiers 106, a combiner 108, a harmonic filter 110 and a power source 118. An antenna 112 is connected to the transmitter to broadcast the signal.

The input source 100 provides an input signal that is an inphase and quadrature (I, Q) description of the baseband complex envelope. The input signal operates through a digital input that carries a baseband representation of the ideal signal to be transmitted. This input would be used when the transmitter operates in the continuous mode. Alternately the transmitter may operate in a pulsed mode where the primary input is used to trigger a pulse from the transmitter and all pulses are the same. The pulse shape is stored in the transmitter defining the ideal voltage waveform for a single pulse. A DSP based equalizer may be used to determine the necessary amplifier voltage waveform from the desired antenna current waveform when operating in the continuous mode. In the pulse mode the ideal voltage waveform would normally be determined before being stored in the transmitter.

The Low Frequency (LF) band has a frequency range of 30 kHz to 300 kHz. Loran-C and its more modern derivatives are transmitted in the LF band at a centre frequency of 100 kHz. In general, the antenna systems used for LF transmission are electrically short because wavelengths are very long and the electrical length of typical antennas is much less than a quarter wave. For Loran, a quarter wave tower would be 750 meters tall. A common antenna used by the United States Coast Guard is the 625 foot (190.5 meters) Top Loaded Monopole (TLM) having an electrical length of only 6% of a wavelength.

A useful factor for characterizing antennas used for LF and Loran transmission is the Q or quality factor. The quality factor is the ratio of energy stored in the electric and magnetic fields of the antenna divided by the energy dissipated in the radiation resistance and other losses over a single cycle. There is a direct relationship between Q factor and bandwidth, as shown in equation 1 where BW is the antenna 3 dB bandwidth and fc is the centre frequency.

$$BW = \frac{f_c}{Q} \qquad \text{Eq. 1}$$

The high Q factor of typical antennas used for Loran is part of what makes transmission difficult and requires analysis for proper system design. Impedance measurements at the antenna base can be used to determine Q. Two antenna measurements are needed, impedance and reactance slope where reactance is the imaginary part of impedance. The antenna can generally be modeled at a particular frequency using a lumped constant series RLC circuit.

The input impedance z of the antenna equivalent circuit is shown in equation 2.

$$z = R + j\omega L - \frac{j}{\omega C} \qquad \text{Eq. 2}$$

From equation 2, the reactance can be determined as the imaginary part of the impedance as shown in equation 3.

$$X = \omega L - \frac{1}{\omega C}$$ Eq. 3

The reactance slope may be determined as the derivative of the reactance with respect to frequency as shown in equation 4.

$$\frac{dX}{d\omega} = L + \frac{1}{C\omega^2}$$ Eq. 4

Solving from Eq. 3 and Eq. 4 the inductance and capacitance of the antenna equivalent circuit can be found as shown in equations 5 and 6.

$$L = \frac{1}{2}\left(\frac{dX}{d\omega} + \frac{X}{\omega}\right)$$ Eq. 5

$$C = \frac{2}{\omega^2 \frac{dX}{d\omega} - \omega X}$$ Eq. 6

Normally the antenna would be operated at resonance where the inductive reactance and capacitive reactance are equal so that the impedance is purely resistive. For the 625' TLM, the antenna needs to be tuned to resonance by adding an additional 39.8 μH resulting in a total inductance of 218.8 μH in the equivalent circuit.

Once the equivalent circuit is determined, the quality factor of the antenna can be calculated using equation 7, which is true for the circuit at its resonant frequency. From this equation it is clear that antennas with higher resistance (radiation resistance plus losses in the conduction path including the ground return) will be lower Q and have wider bandwidth.

$$Q = \frac{\omega L}{R} = \frac{1}{\omega CR}$$ Eq. 7

Figure 2:
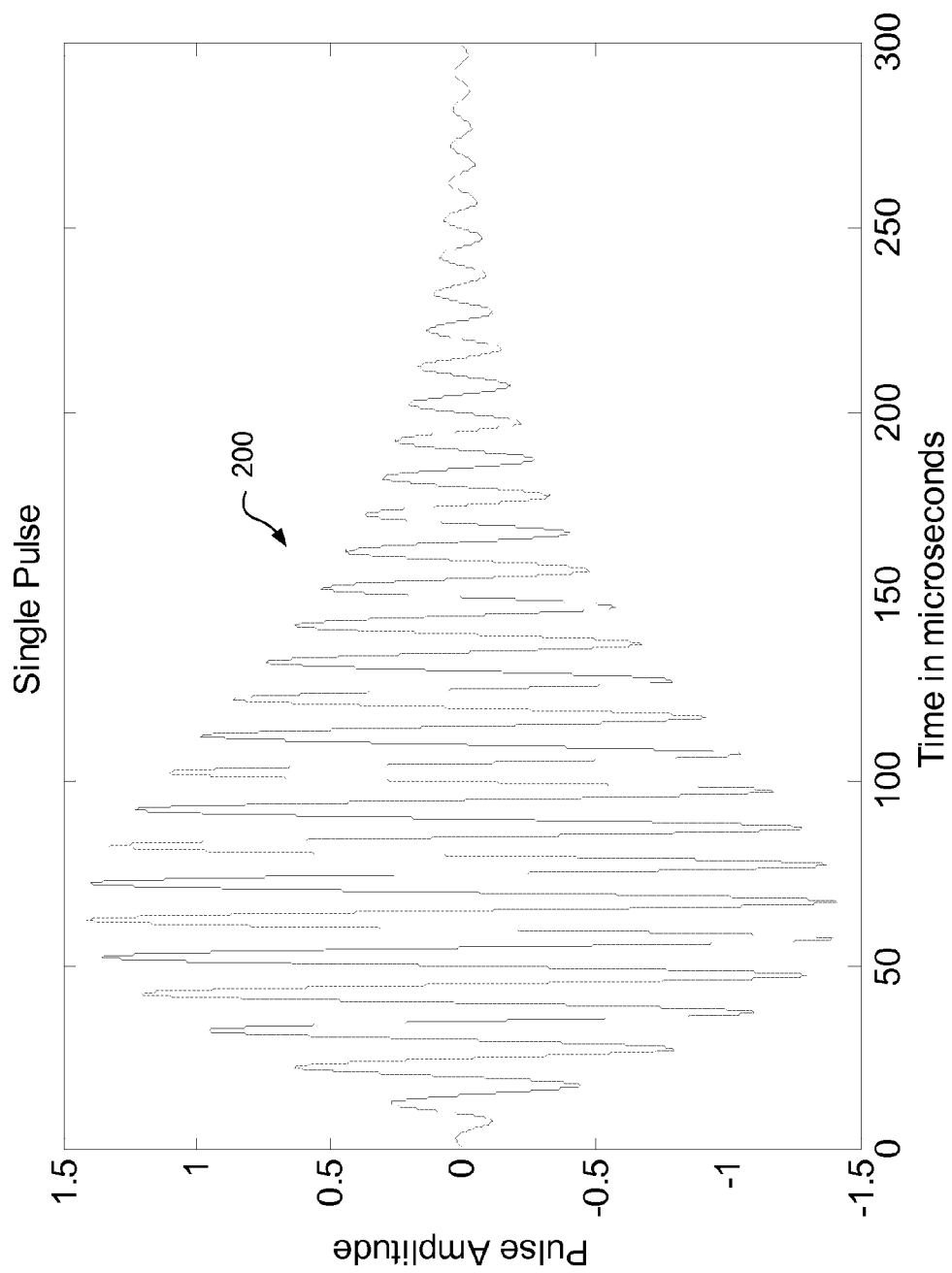
FIG. 2 is a graph representing a Loran pulse in the time domain.

Antennas used for Loran transmission are characterized by relatively short electrical lengths when compared to the transmitted wavelength. A time domain representation of a Loran pulse is shown in FIG. 2.

Figure 3A:
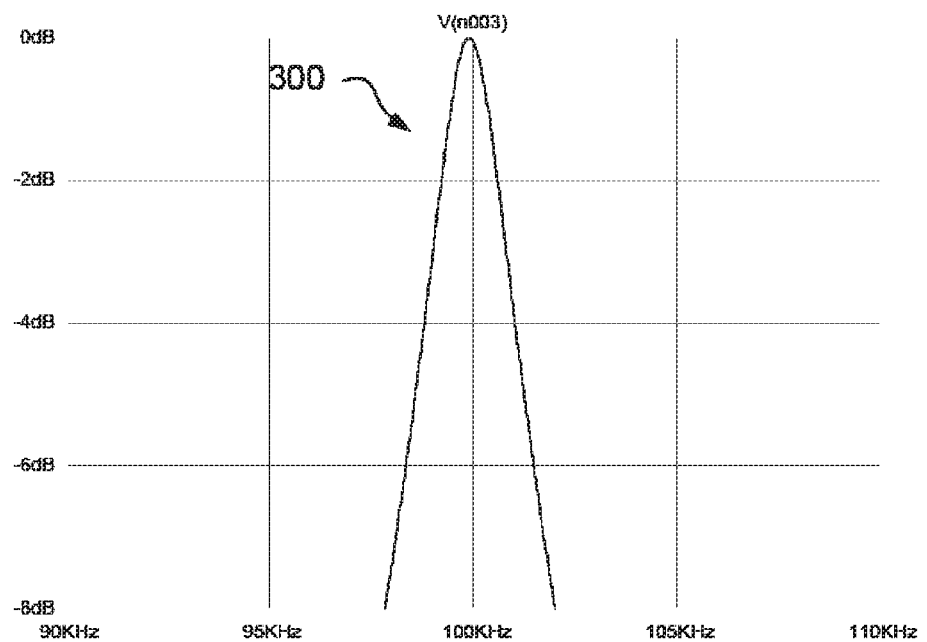
FIG. 3A is a graph of a typical narrow band antenna magnitude response.
Figure 3B:
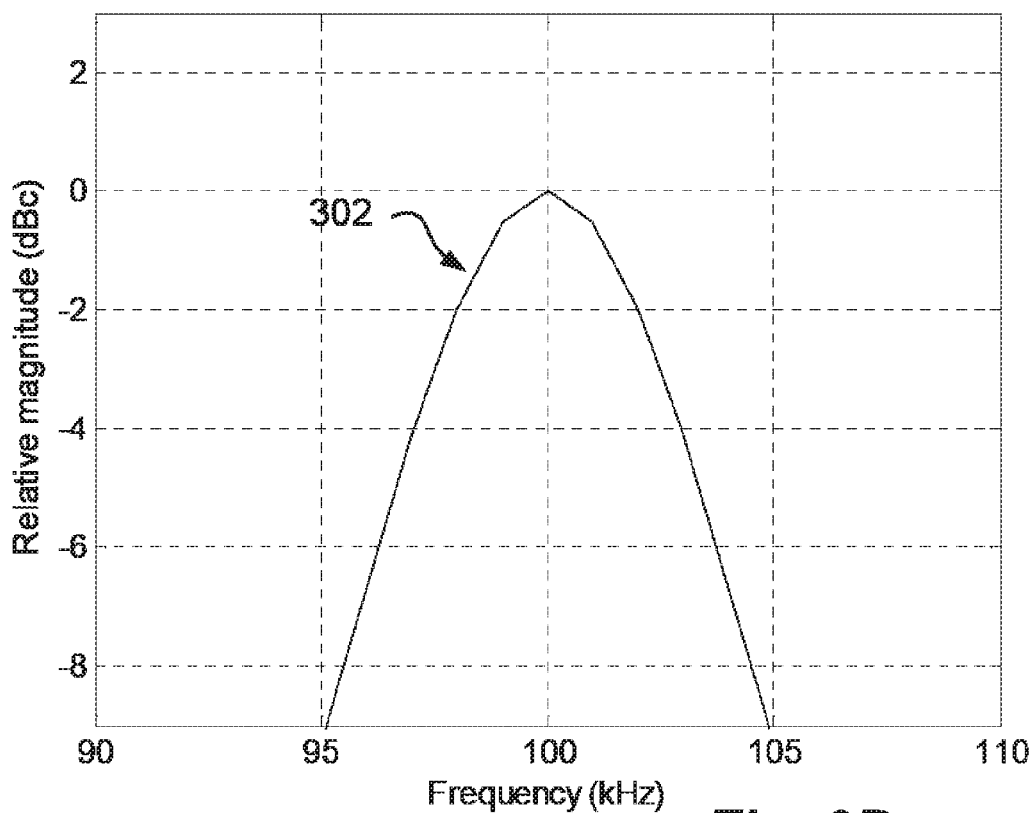
FIG. 3B is a graph representing a Loran pulse spectrum.

Comparing FIG. 3A, which shows the magnitude response of a typical narrow-band antenna in a Loran system, and FIG. 3B which shows Loran signal pulse spectrum, it is clear that the Loran signal occupies significantly more bandwidth than what is available in the antenna. Objectively, the antenna 3 dB bandwidth is 1.8 kHz and the Loran pulse 3 dB bandwidth is approximately 5 kHz. For most transmission systems, including AM audio broadcast in the medium wave band, the antenna bandwidth generally exceeds the transmitted waveform bandwidth. When there is a significant antenna bandwidth deficit, as is the case here, we can no longer think of the antenna impedance as being steady state in either time or frequency. A transient relationship exists which requires transient analysis techniques to be properly understood. In most all other antenna system analyses at higher frequency, steady state analysis techniques are used exclusively.

The next step is to quantify the transient effects based on the specific transmitted waveform and the equivalent circuit that we have developed. To simplify the mathematics significantly, a frequency transformation of the equivalent circuit from bandpass to lowpass is used. In this transformation, the second order antenna equivalent circuit becomes the simplified first order equivalent circuit shown in FIG. 6.

The Loran pulse also needs to be transformed to a lowpass equivalent for the analysis. Because the ideal bandpass pulse from equation 8 has a linear RF phase characteristic (no phase modulation), the lowpass equivalent is simply the pulse envelope shown in equation 9.

$$i(t) = t^2 e^{-at}$$ Equation 9:

The lowpass equivalent circuit is governed by the network equation, equation 10.

$$V(t) = i(t)R + L\frac{di}{dt}$$ Equation 10

Equation 11 is the result of solving for the lowpass driving voltage needed to give the correct response.

$$V(t) = (2Lt - aLt^2 + Rt^2)e^{-at}$$ Equation 11:

The lowpass equivalent circuit must have a 3 dB bandwidth which is one half of the 3 dB bandwidth of the antenna to achieve the same envelope response. For the case of the 625' TLM lowpass equivalent, the correct lowpass bandwidth is 909 Hz. This specific 3 dB bandwidth makes the calculation of L and R straightforward.

Figure 4A:
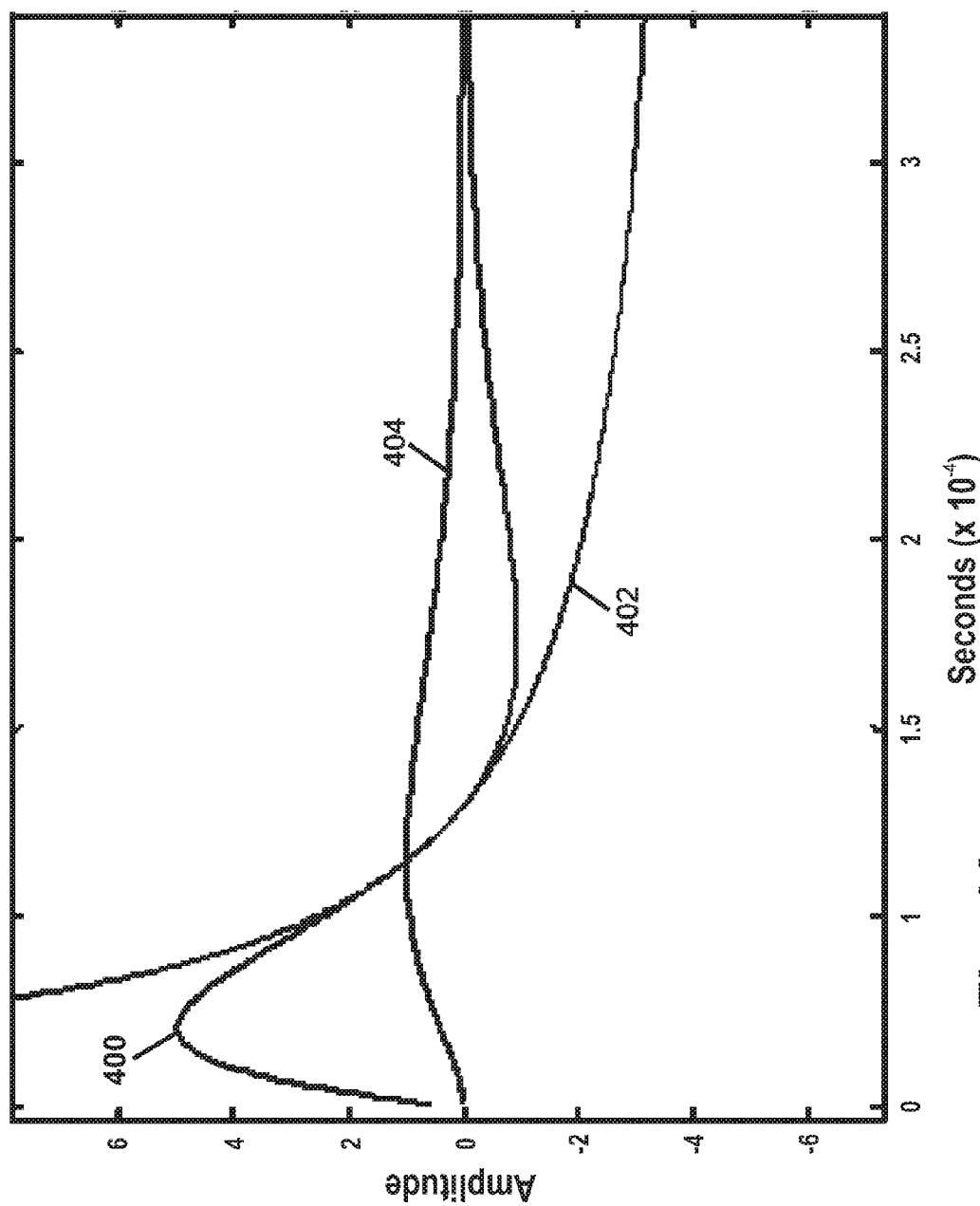
FIG. 4A is a graph of the Loran pulse envelope, the voltage envelope required from the transmitter, which is equalized, and the instantaneous impedance.

FIG. 4A shows the network response.

The antenna, highly capacitive due to the short electrical length, is normally series resonated with a loading inductor to minimize the reactance at the centre frequency. As a result of the lack of antenna bandwidth, the required driving voltage envelope 400 has a very different envelope than the resulting desired current envelope 402. The instantaneous impedance 404 of the antenna (the ratio of voltage to current at one instant in time) varies throughout the pulse from a very large level initially to close to the steady state base impedance near the pulse peak and finally becoming negative during the pulse tail. When the impedance is negative, power is flowing out of the antenna back to the transmitter.

The current envelope is readily recognizable as a Loran pulse envelope. The voltage waveform is very different from the current and is characterized as having a high initial peak followed by a rapid decay and a negative region after the peak of the current waveform. The difference between the voltage and current envelope is a key concept in understanding the challenge of Loran transmission systems. The voltage peak in this case is approximately five times higher than the current peak, representing an effective "transient voltage factor" (TVF) of five. For a system where the antenna bandwidth is greater than the signal bandwidth (i.e., MW Broadcast), the current waveform and voltage waveforms would be almost the same representing a TVF approaching one. In general, the TVF may be used to determine the transmitter peak power capability, for a given antenna and pulse shape. Peak power capability is reduced from its ideal steady state value proportionately to the TVF.

The very high initial voltage peak shown in FIG. 4A provides the power to rapidly increase the stored energy and current in the reactive (lossless) elements of the antenna circuit. The majority of the power flowing from the source at the beginning of the pulse is not being dissipated, but stored in the electric and magnetic fields of the antenna. As the current and voltage waveforms vary, the impedance seen by the transmitter varies widely through the pulse. The impedance is initially very high, decreases to the steady state value at the current peak and then becomes negative in the pulse tail. A broadcast transmitter is not designed for these variations in impedance and would shut down in such a situation. An important observation is that after the peak in the current waveform, the stored energy in the antenna circuit must be damped faster than its natural damping rate and the source voltage waveform becomes negative as energy flows from the antenna back to the transmitter.

It is desired that the transmitters used in the present system are capable of being modulated by digitally selecting carrier amplifiers. Typically, an exciter/modulator is placed within the system to modulate the transmitter.

The actual architecture of the exciter/modulator is not particularly important. Instead, the exciter/modulator should have the following desired features: 1) ability to remove failed amplifiers from the modulation sequence; 2) ability to operate with both pulsed and continuous modulation sequences; 3) enable and disable amplifiers in the pulsed modulation mode following a preset, prequantized sequence; 4) capability of switching the amplifiers between active and passive damping modes, when the modulation is negative; and 5) ability to provide an envelope quantization process for the continuous modulation process. The quantization block might also include a randomizer that selects amplifiers randomly in time. The randomization serves to equalize the power delivered by individual amplifiers over time. Another possible desired feature of the exciter/modulator is to include a finite impulse response (FIR) equalizer to equalize an external I, Q or input from the continuous modulation sequence.

Transmitters for use in the present system are modulated by digitally selecting carrier amplifiers. Typically, Class D amplifiers are used as a result of their ability to be modulated by digitally selecting carrier amplifiers. A single amplifier can only achieve very limited amplitude modulation. As a result, a single amplifier effectively has only two states, on or off (active or inactive). The two states only allow for two amplitude levels. To modulate a complex waveform, such as Loran, more amplitude states are required from the transmitter. Accordingly, some means to allow for a wide range of amplitude modulation must be employed. This can be achieved by using many amplifiers (2 or more) and operating them in the active or inactive states in different ratios at different times (as described in Swanson, U.S. Pat. No. 4,580,111), or by using one or more amplifiers and controlling the DC power source voltage (2 in FIGS. 7A-7G). It should be noted that there are numerous different ways in which the source voltage could be modulated.

To achieve modulation and recover power from the antenna, each amplifier may be operated in one of four modes: inactive mode, active mode, passive damping mode and active damping mode. The actual mode of each amplifier can be controlled by the exciter/modulator on each full RF cycle.

Figure 5:
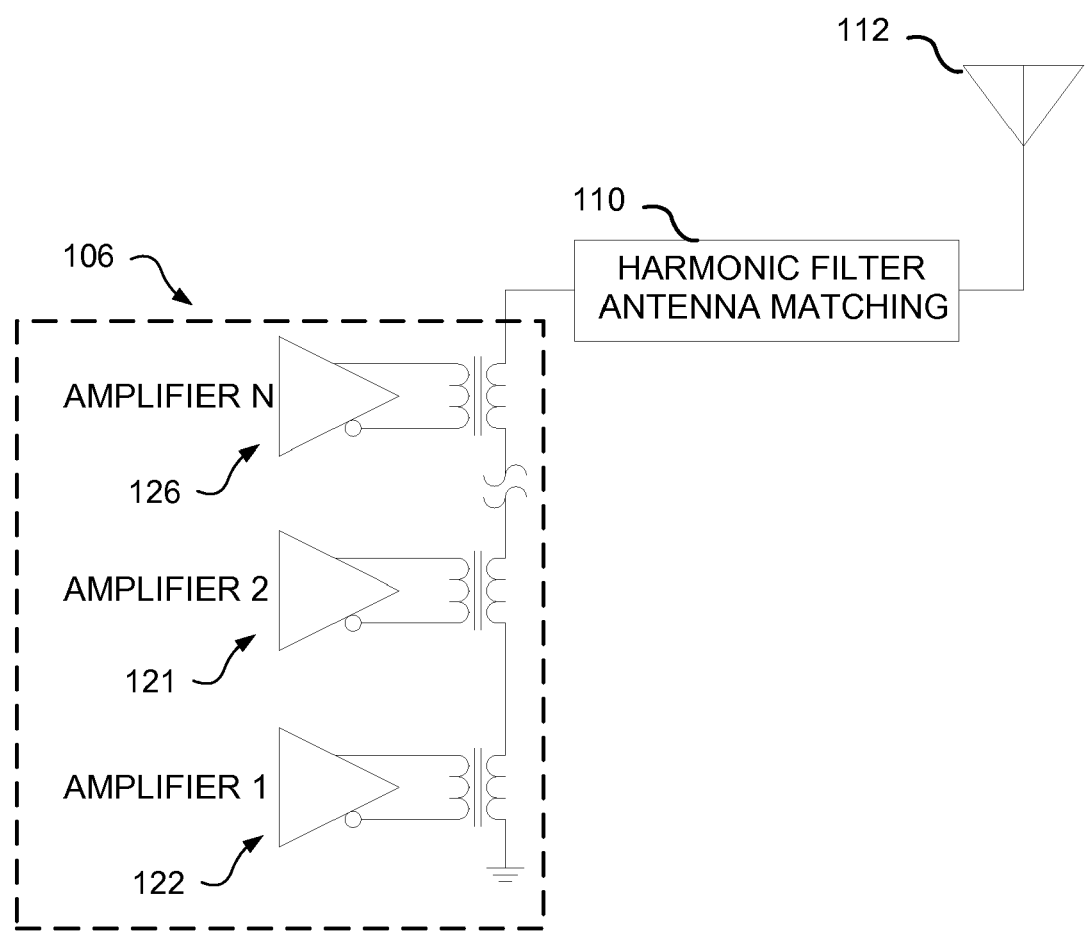
FIG. 5 is a representation of a step modulation system.

For Loran, step modulation (aka digitally selecting carrier amplifiers) is used to achieve amplitude modulation as shown in FIG. 5 schematic. Step modulation makes use of the fact that a large number of amplifiers must be combined to achieve the high power levels required. On each RF cycle or half RF cycle, the exciter makes a decision on the magnitude of voltage required to achieve the desired RF current waveform and the number of amplifiers operating is adjusted proportionately to the desired voltage waveform. Amplifiers that are not operating on a given RF cycle are in a low-impedance, zero voltage state. FIG. 5 shows a schematic of a step modulated transmitter using class D amplifiers. Amplifier 106 is comprised by multiple amplifiers from 1 to N (122 to 126) to drive a power combiner system composed of a magnetic core and primary winding associated with each individual amplifier, with a single secondary winding combining all the amplifiers outputs in series. The combiner output voltage is simply the sum of the input voltages, corrected for the primary to secondary turn ratio of the individual transformers. The combined output waveform is then connected to the harmonic filter 550, antenna tuning and antenna circuit and antenna 112. It should be noted that other methods of combining may also be implemented.

As with any transmitter system based on Class-D amplifiers, attenuation of carrier frequency harmonics is required due to the square wave voltage produced by the amplifier at the carrier frequency. In the case of Loran transmission, where the impedance of the antenna varies significantly during the pulse, additional requirements are placed on the harmonic filter design. The harmonic filter 110 is characterized by series resonant sections in series with the antenna and parallel resonant sections in parallel with the antenna. This architecture for the antenna provides for a low-pass filter with very low source impedance and near zero phase delay such that the transmitter behaves as closely as possible to an ideal voltage source. The behaviour of a voltage source is desirable as it has ideal transient response which allows for maximum control over the antenna current during the wide range of impedance variations present at the input of the Loran antenna.

Figure 6:
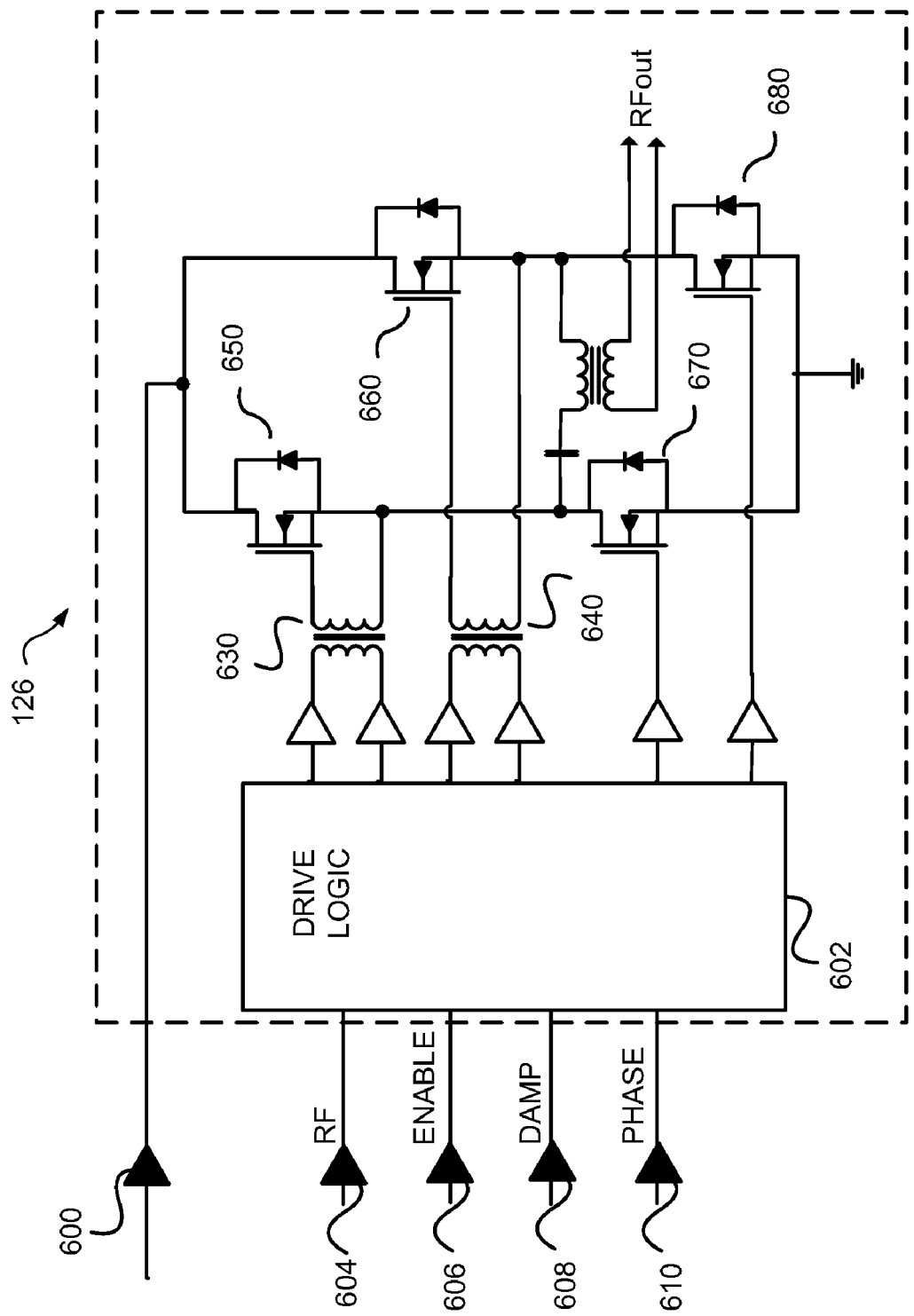
FIG. 6 is a representation of an amplifier for use with a narrow-band antenna.
Figure 7:
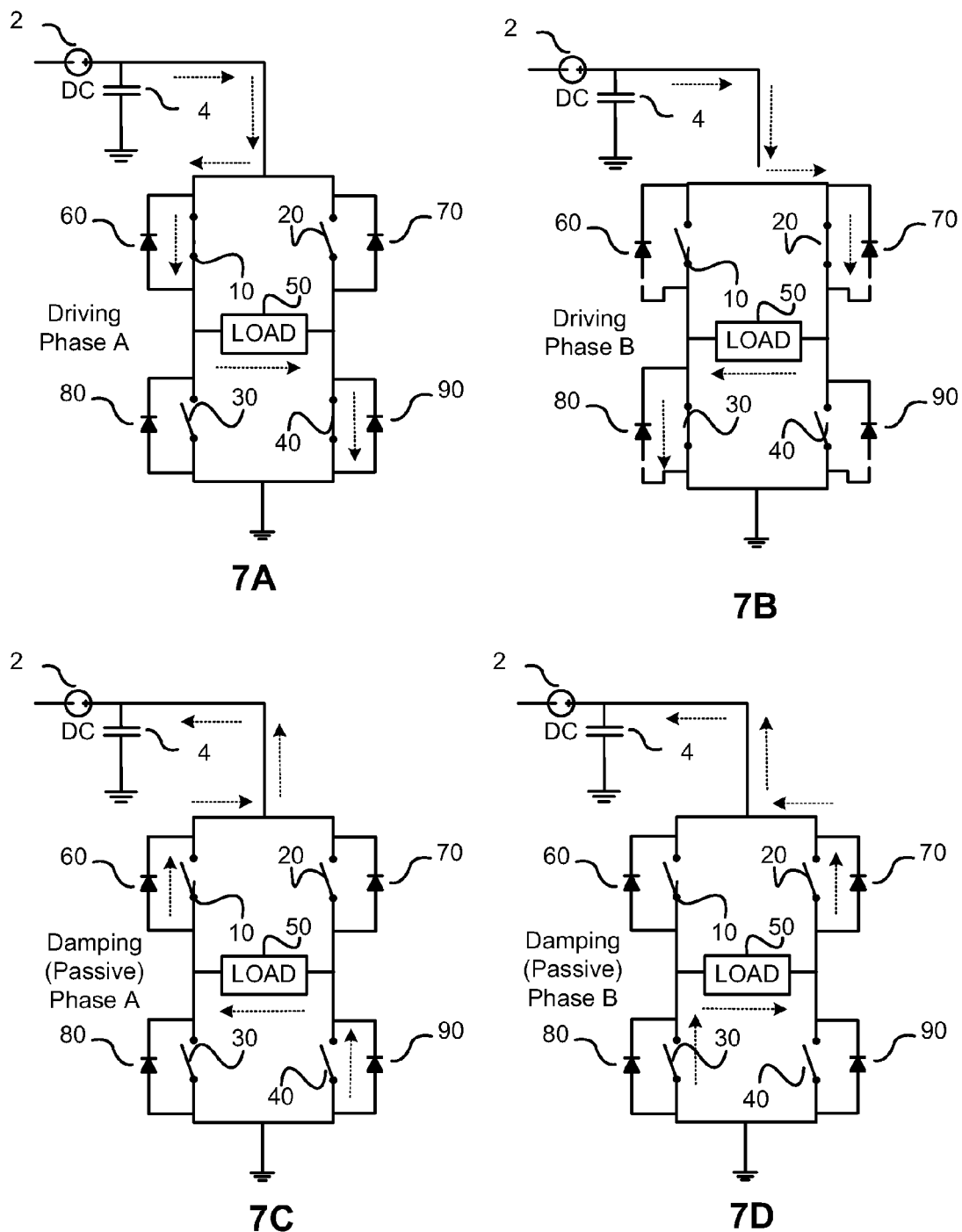
FIGS. 7A to 7G are representations of the states of the amplifier.
Figure 7:
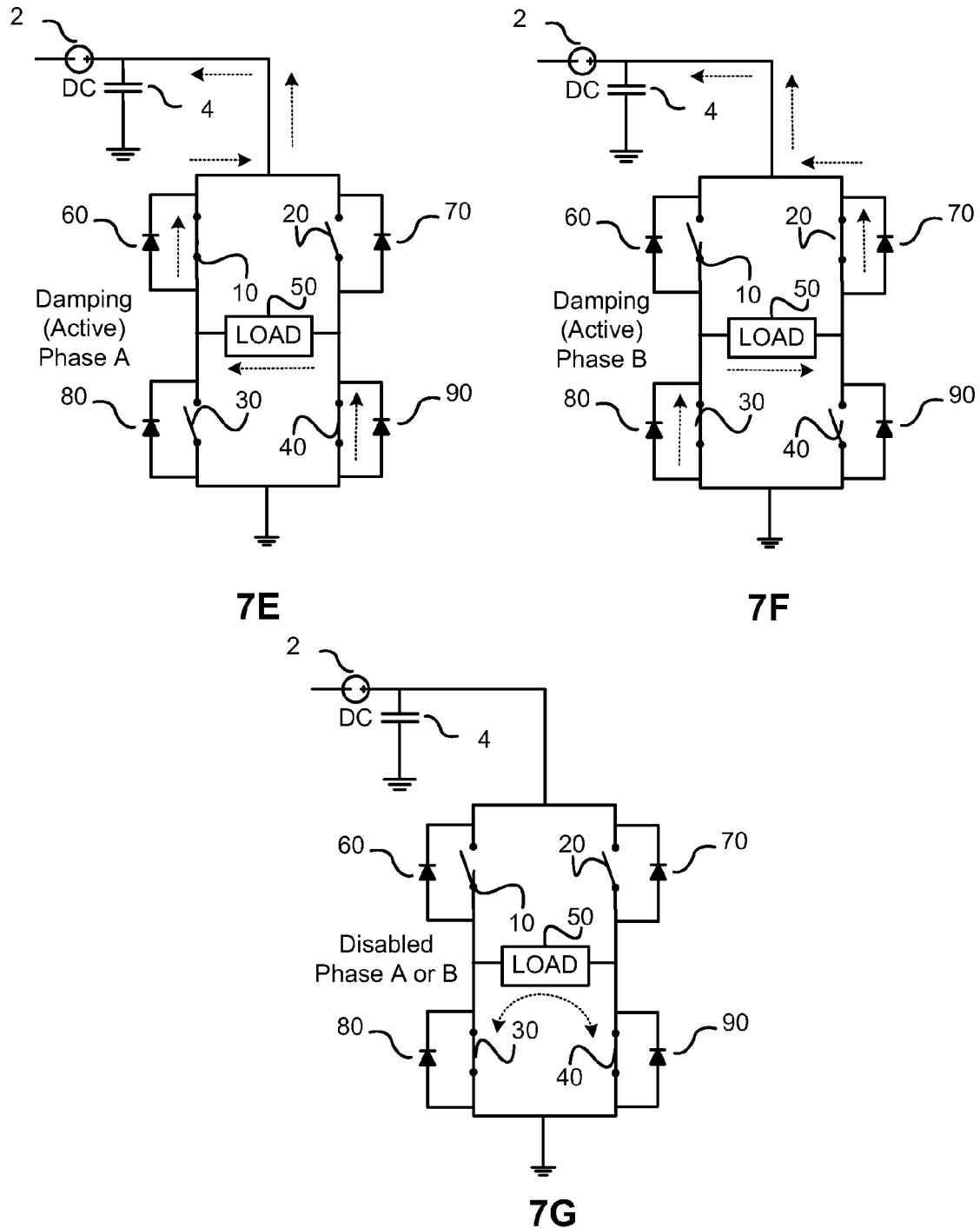

FIG. 6 shows a schematic of an amplifier for recovering power from a narrow-band antenna. As shown in FIG. 6, the operation of each amplifier 122 to 126 is controlled by the combination of an amplifier drive logic 602 and associated circuitry. The drive logic 602 and associated circuitry must be able to receive from the exciter at least four signals, namely an RF drive signal 604, an enable signal 606, a damp signal 608 and a phase signal 610, to each amplifier. The amplifier design enables instantaneous phase reversal as required by Loran. This is achieved by having an RF phase input which is the control input as well as the separate phase input. The ability to put the amplifier into "passive damping mode" enables the antenna to free run so as to minimize losses due to switching the amplifiers and drivers during the period of time that power is recovered from the antenna. The drive logic enables control of the transistors so that they are in any state on any cycle.

The RF drive signal 604 contains the RF phase information from the RF source, namely the desired amplifier voltage zero crossings. For the transmission of a Loran signal, this signal 604 would operate as a continuous 100 kHz square wave with no phase modulation although this signal could be any type of signal. All mode changes are made synchronously with the RF Phase signal 610, which is used as a clock to detect the mode control signals. The amplifier itself should contain an adjustable dead time control that allows the dead time to be adjusted to allow for reduction of switching loss.

The enable signal 606 can be either inactive or active. When the enable signal 606 is inactive, the amplifier is in a zero voltage, low impedance state with the top two transistors 650, 660 in the bridge in an open or off position and the bottom two transistors 670, 680 in the bridge in the closed or on position. When the enable signal 606 is active, the amplifier may be in the Active mode, the Passive Damping mode or the Active Damping Mode as determined by the RF drive 604, Damp 608 and Phase 610 Signals.

When the damp signal 608 is active and the enable signal 606 is active, all transistors 650, 660, 670, 680 in the amplifier are shut down and it operates as a bridge rectifier. This is the high impedance mode used when the antenna impedance is negative and the power is flowing from the antenna back to the amplifier.

The phase signal 610 is used to invert the voltage output of the amplifier with respect to the RF Drive signal 604. During normal Loran operation, the Phase signal 610 would be triggered throughout some of the pulses where a negative phase code pulse was desired. Additionally, if the Phase signal 610 was inverted when current was already flowing in the antenna, the impedance phase would be inverted, i.e. positive impedance to negative impedance, and the amplifier mode would change from Active mode to Active Damping mode.

As shown in FIG. 6, the two lower transistors 670, 680 have direct coupled gate drive as their source leads are grounded. Driving these transistors does not require the gate drive to be floated at the B+ voltage source 600. The two upper transistors 650, 660 require an isolated gate drive circuit. This isolated gate drive circuit can be achieved by using a transformer 630, 640. When the amplifier is disabled, it is necessary that transistors 650, 660 are off continuously. This requires that the DC voltage be zero. To improve the transient response of the gate drive circuitry two drivers are used for each transformer 630, 640. This improves the gate drive transient response when it is started and stopped due to the amplifier being enabled or disabled.

To achieve the inactive mode, direct DC coupling from the drive circuit 602 to the transistor gates is required for the continuously on transistors 670, 680. This DC coupling improves amplifier robustness. The improved robustness is the result of the amplifier remaining in its lowest impedance state during the presence of uncontrolled currents due to lightning or other effects. This low impedance state is achieved when two transistors are on continuously and current may flow in the output with a low impedance. In addition, switching losses are minimized.

Since multiple amplifiers are used, a suitable series combiner is required. The combiner should have output current and voltage transducers for instrumentation, protection and adaptive modulation. In addition, an impedance matching and harmonic filter is required. The antenna system must be inductively loaded such that the antenna and loading inductor together form a series resonant circuit, resonant at the transmitter carrier frequency. Accordingly, a servo controlled variometer or some other means is required to maintain the circuit at the correct resonant frequency. Furthermore, the loading inductor circuit should be modified so that suitable modification of the odd harmonics will be provided.

The power required from the main DC power supply in the present system is relatively low compared to AM and FM broadcasting. Moreover, since the number of amplifiers may be small, the envelope modulation system is not readily adapted to fine regulation. As a result, a regulated B+ power supply is preferred.

As a result of the high peak to average (power) ratio of the transmitted signal, particular attention has to be paid to the type of B+ decoupling capacitors used for the application. Moreover, controlled regulation of the transmitted peak pulse amplitudes is a requirement for Loran signal transmission.

Schematic representations of the operational states of the amplifier are shown in FIGS. 7A to 7G. Gates 10, 20, 30 and 40 combined with diodes 60, 70, 80 and 90 correspond to transistors 650,660, 670 and 680 respectively of FIG. 6.

The active mode is characterized by the normal operation where the amplifier is contributing energy to the load or antenna 50 where the voltage and current are in phase as shown in FIGS. 7A and 7B. Two states may be defined for each mode based upon the phase of the signal. To source energy to the antenna, the voltage applied by the amplifier across the load 50 should be in phase with the current. When the current is flowing in the direction of the arrow, transistors 10 and 40 are closed and transistors 20 and 30 are open as shown in FIG. 7A. When the alternating (sinusoidal) current reverses polarity or phase, transistors 10 and 40 are open and transistors 20 and 30 are closed as shown in FIG. 7B. The output voltage of the transmitter is proportional to the number of amplifiers in the active mode. The impedance recognized by the amplifier is variable depending on the current at the downstream combiner at that particular moment in time. The combiner current is determined by the number of active amplifiers as well as the load Q and the history of modulation. The amplifier(s) remain in the active mode as long as the load impedance remains positive and energy flow is into the antenna 50.

As shown in FIGS. 7C and 7D, in the passive damping mode, all transistors 10, 20, 30, 40 are off and rectifiers 60, 70, 80, 90, typically in the form of diodes, associated with each transistor operate as bridge rectifiers. If MOSFET transistors are used, the rectifiers are formed by the reverse body diodes of the MOSFET and external rectifiers are not required. In certain circumstances, separate rectifiers could be used if another type of semiconductor switch is used that does not have an acceptable rectifier device. During the passive damping mode, power flow is negative as energy (depicted by the arrow) is recovered from the antenna 50 and stored in the power supply 100 decoupling capacitors. At this point, the amplifier(s) essentially look like a voltage source, but with the negative of the supply voltage and the load impedance is negative with a level determined by the combiner current during that particular RF cycle and the number of amplifiers in the passive damping mode.

In the passive damping mode shown in FIGS. 7C and 7D, the antenna is causing current to flow in the amplifier (50 is a source of current) and all the transistors 10,20,30, 40 are open. With the transistors 10, 20, 30, 40 open, the rectifiers 60, 70, 80 and 90 act as bridge rectifiers and rectified RF current flows back to the source 2 providing a capacitor 4 for storing power thus absorbing energy from the antenna 50. During one half cycle of the RF current flow, rectifiers 60 and 90 are in conduction and rectifiers 70 and 80 are off as shown in FIG. 7C. During the other half cycle, the current flow reverses, rectifiers 70 and 80 are in conduction and rectifiers 60 and 90 are off as shown in FIG. 7D. When in the passive damping mode, the voltage applied to the antenna 50 is proportional to the number of amplifiers in the passive damping mode, but in opposition to current flow making the voltage effectively negative. At this time, the impedance seen by the transmitter is also negative.

During passive damping the system can still be voltage modulated, since the output voltage of the transmitter is proportional to the number of amplifiers that are active in the passive damping state.

In the active damping mode shown in FIGS. 7E and 7F, operation is very similar to the passive damping mode however, the transistors 10, 20, 30 and 40 continue to switch as if they were sourcing power to the antenna 50, but the phase is reversed 180 degrees such that the driving voltage, which is now inverted, is out of phase with the antenna current. For example in FIG. 7E gates 10 and 40 are closed, and 20 and 30 are open while for the reversed phase gates 10 and 40 are open and gates 20 and 30 are closed. Operation is otherwise unchanged. This mode would normally be activated by inverting the RF Drive signals. Typically, this mode would not be required for a standard Loran pulse, since the pulse tail phase is not critical. However, it may be beneficial to employ the active damping mode in a case where it is necessary to achieve some degree of phase modulation during periods where the impedance is negative and power flow is from the antenna 50 back to the transmitter. Phase modulation may be achieved by causing the transistors 10, 20, and 40 to close slightly before, or stay closed slightly longer than the normal rectifier conduction would have occurred in the passive damping mode. The ability to provide active damping provides control of the phase as opposed to passive damping where phase control is not maintained. As with the passive damping mode, the system is still voltage modulated during active damping, since the output voltage of the transmitter is proportional to the number of amplifiers that are active in the active damping state.

As shown in FIG. 7G, during the inactive mode of operation, the amplifier is off and is essentially out of the circuit. Both bottom transistors 30, 40 are continuously on and both top transistors 10, 20 are continuously off. Alternately, both top transistors 10, are continuously on and both bottom transistors 30, 40 are continuously off. Between input signals, such as Loran pulses, when no power is flowing in the antenna 50, and when the transmitter is protecting itself from lightning, feed line arcs or other events that threaten the RF transistors, as determined by protection circuits and devices, all amplifiers within the transmitter are in the inactive mode. During this mode, the alternating radio frequency current from the antenna circulates from the source 50 around a loop composed of transistors 30, 40 and through the ground connection between them. While this current is circulating, the amplifier is neither contributing nor absorbing power from the load as the voltage around the loop is very low.

There are limitations in the ability of the amplifier to recover power from the antenna. The primary limitation is that when the antenna current becomes very small it is insufficient to fully charge and discharge the self-capacitance of the transistors used in the class-D amplifier during each RF cycle. As a result the rectifiers never become forward biased allowing power to flow from the antenna back to the power supply. The magnitude of RF antenna current where this effect becomes significant is relatively small so it does not represent a significant energy loss. However, the Loran signal specification requires that the pulse tail current be damped to very low levels at the end of the pulse. These levels are less than the level where the amplifier operates as an effective damping system so another method of pulse damping is required late in the pulse tail. In the preferred embodiment, one or more amplifiers are modified to operate only as a resistive damping element when required at the end of the pulse. The amplifier is modified by removing the connection to the power supply 2 and the top transistors 60 and 70 while adding an appropriate resistor in parallel with the load 50. The resistive damping element operates in one of two modes. In the first mode, the inactive mode, transistors 80 and 90 are on and load current circulates from the load through transistors 80 and 90 and the amplifier is effectively out of the circuit. In the active mode transistors 80 and 90 are open and the antenna current flows through the resistor in parallel with the load. In the active mode the resistive damping element effectively places the damping resistor in series with the load current thus damping the antenna current without the limitations described when an amplifier recovers power from the antenna.

In the low-pass equivalent analysis, as seen in FIG. 4A, the voltage source needs to be able to operate with a negative voltage after about the 80 microsecond point in the pulse. Similarly, the voltage also needs to be negative for a transmitter operating on the radio frequency signal at 100 kHz. This is achieved when the voltage waveform is inverted and the RF current and voltage at the transmitter output are out of phase. The voltage phase reversal can be seen in FIG. 8.

Figure 4B:
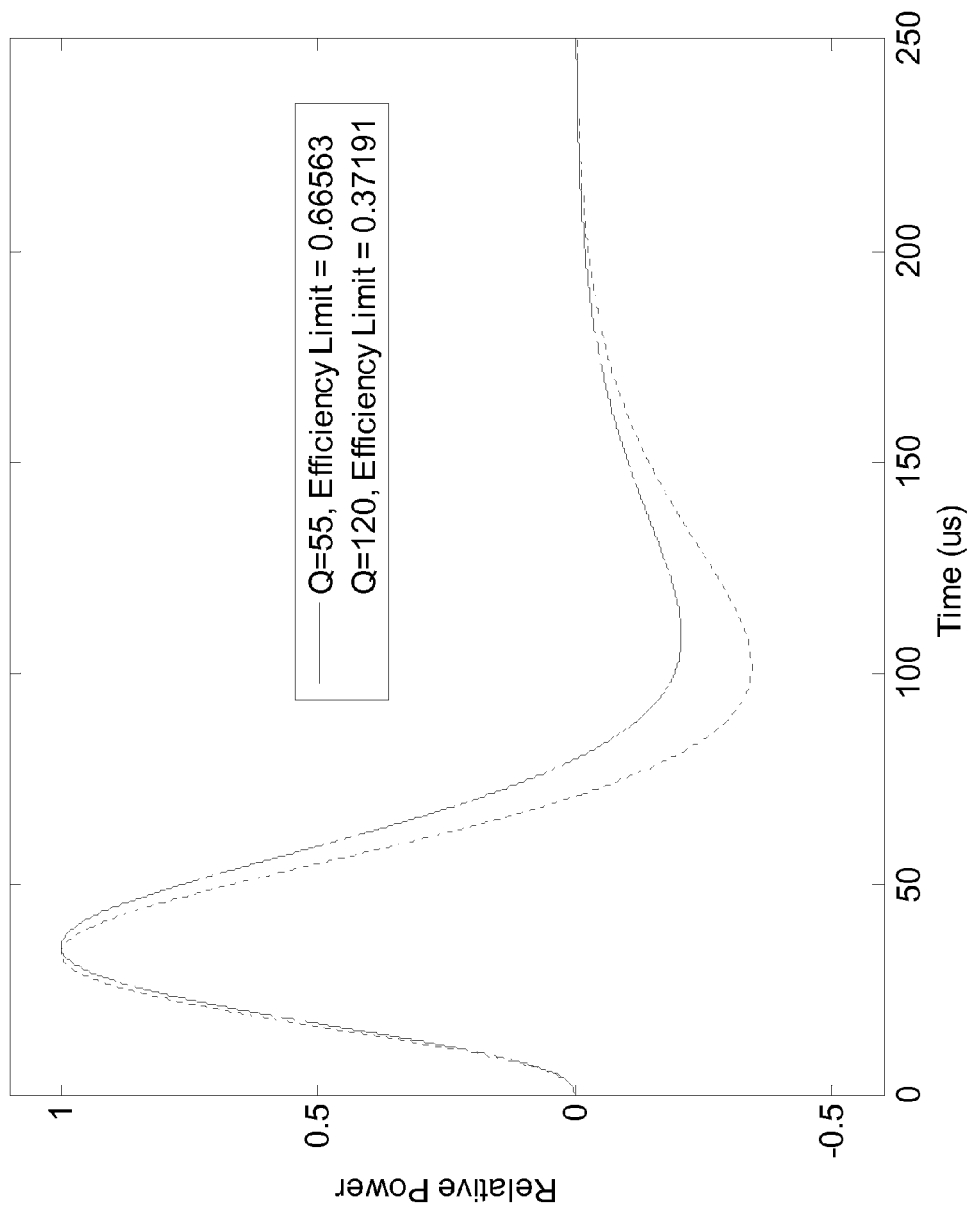
FIG. 4B is a graph showing antenna power flow and efficiency limit.

The advantage of damping the antenna current in the way described above is that the amplifiers effectively operate as rectifiers allowing antenna current to flow back to the DC power supply, recovering the energy stored in the antenna. This significantly increases the overall system efficiency. A transmitter operated without the capability to recover power suffers from an additional efficiency factor related to the energy in the pulse tail that is wasted. FIG. 4B shows the power flow in the antenna system derived from the voltage and current waveforms where the power flow is simply the product of the voltage and current envelopes. The antenna with the higher Q, more narrow bandwidth, is less efficient in delivering power and therefore will benefit more from the ability to recover stored power.

The efficiency limit calculation is shown in equation 12 where ηMAX is the upper bound of efficiency, ES is the energy flowing from the transmitter to the antenna calculated from the area under the positive power portion of the curve and ER is the energy flowing from the antenna to the transmitter calculated from the area under the negative power flow portion of the curve.

$$\eta_{MAX} = \frac{E_S - E_R}{E_S} \qquad \text{Eq. 12}$$

Without power recovery capability, the absolute efficiency limit for an antenna Q of 55 is 67% and for an antenna Q of 120 the limit is 37%. Another way of looking at this is the increase in AC power consumption of the transmitter. For a Q of 55 the transmitter without power recovery capability will consume 49% more power (all other efficiency factors equal) and for an antenna Q of 120 the transmitter without power recovery capability will consume 2.7 times more power. It should be noted that this efficiency factor is solely based on the ability to recover stored energy in the antenna and is not related to other efficiency factors such as the DC to RF conversion efficiency of the RF amplifier or the AC to DC conversion efficiency of the main power supply.

The Class D amplifiers using MOSFET switching transistors have very short turn on and turn off times on the order of a few tens of nanoseconds. The switching times are due to fixed inductances and capacitances associated with the semiconductor and its package. The switching times are very repeatable allowing the transmitter to have a very constant delay time from pulse trigger input to resulting RF output waveform. Pulse to pulse jitter times should be on the order of 1 nanosecond or less.

Because of the high efficiency of the system, power supply design is somewhat simplified. The use of a tightly regulated primary power supply as well as ample energy storage capacitors allow for very tight pulse to pulse amplitude regulation. For the prototype system, the theoretical pulse amplitude regulation through a nine pulse group is 0.3%.

Loran antennas themselves may be somewhat inefficient with the antenna efficiency of typical North American systems in the range of 50 to 75%. This factor must also be included in overall system efficiency.

The average radiated power of a typical Loran system is surprisingly low. Radiated power may be calculated based on the energy of an ideal pulse. Integration of Equation 8 yields a pulse energy of 83.4 μJoules/watt peak which is the total energy in a single pulse of 1 rms watt on the peak half cycle.

So a system which radiates 400 kW peak is radiating 33.4 Joules per pulse. For a single rated 400 kW system running at 125 pulses per second, the total radiated power is only 4.2 kW. However for an antenna that is only 50% efficient, the transmitter must deliver 8.4 kW. The total power consumed, based on a 70% transmitter efficiency would be 12 kW. This power would scale up to 29 kW at 300 pps.

Figure 9:
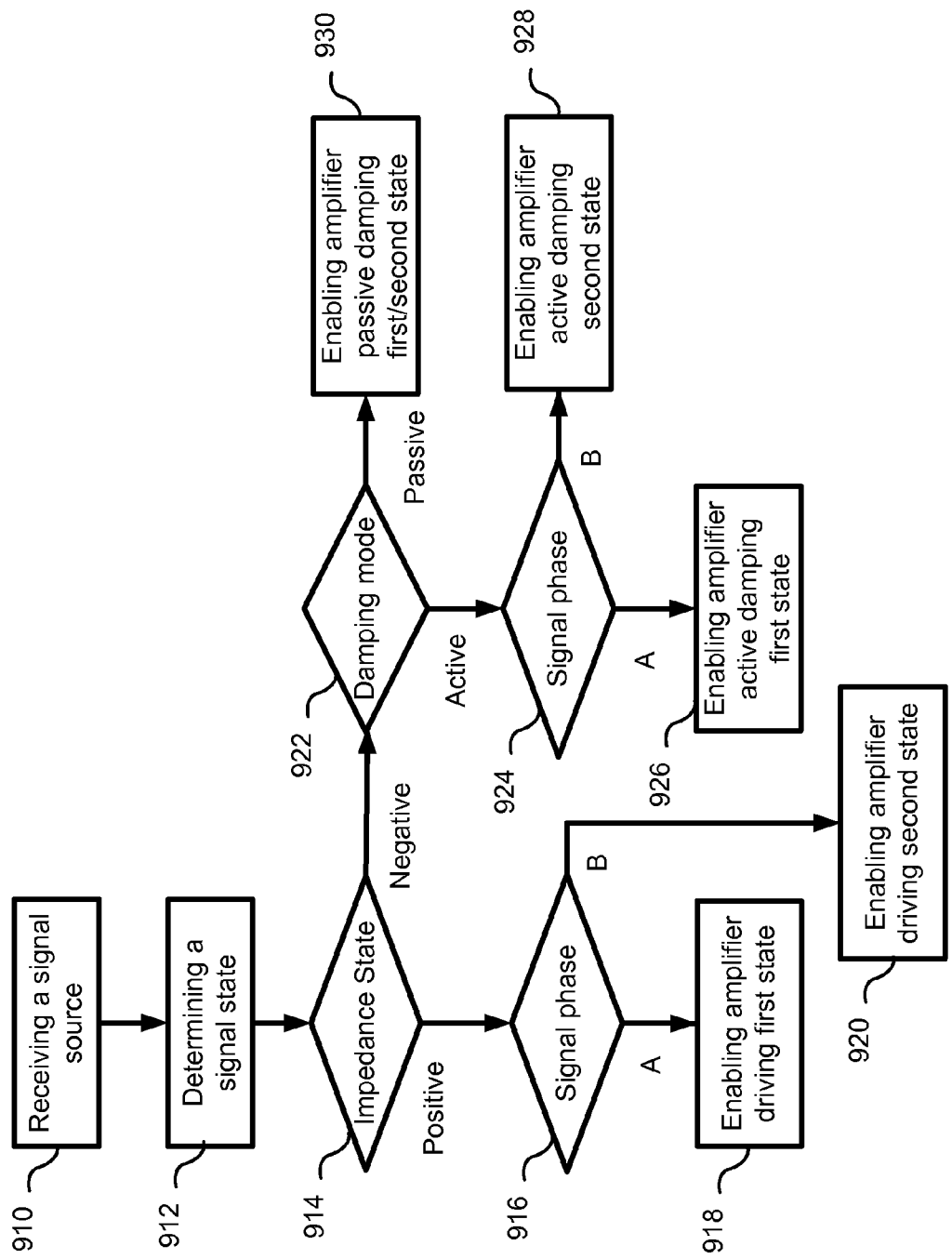
FIG. 9 is a method of controlling an amplifier for providing power recovery.

FIG. 9 shows a method of operating an amplifier for providing power recovery from a narrow-band antenna. A signal source is provided at 910. The signal state is determined at 912 either based upon characteristics of the signal source or by a predetermined switching sequence, as in the generation of a Loran pulse. The impedance state of the antenna is determined at 914. Either the antenna current is being amplified or dampened. If amplification is occurring, the impedance state of the antenna is positive and active mode from one or more amplifiers is required. The phase of the signal is determined at 916. Based upon the phase of the signal a first state A of transistor configuration, such as shown in FIG. 7A, is selected and enabled at 918. When the phase changes to state B a second state as shown in FIG. 7B is selected at 920. The first and second states can be alternated based upon a positive or negative phase of the signal. In addition the amplifiers alternate between states sequentially. For example for a positive phase the amplifier would switch between state 7A and 7B, where as for a negative phase it would switch between 7B and 7A. If amplification is not occurring, the impedance state of the antenna is negative and damping mode from one or more amplifiers is required at 922. Damping mode can occur in either an active mode or passive mode based upon signal damping requirements. If passive mode is required either a first of second passive damping mode is selected at 930 as shown in FIG. 7C or 7D. If active damping is required at 922, the phase of the signal is determined at 924. Based upon the phase of the signal a first active damping state A of transistor configuration, such as shown in FIG. 7E, is selected and enabled at 926. When the phase changes to state B a second state as shown in FIG. 7F is selected at 928. During damping current flows to the voltage source charging one or more capacitors and thus recovering power. As in the active mode, the states of the damping modes may be alternated between the two respective state configurations based upon the initial phase state for passive and active damping. At each stage a specific number of amplifiers may be utilized proportional to the desired magnitude of the voltage waveform. If the desired impedance is positive the selected amplifiers are in the driving mode, if the desired impedance is negative the selected amplifiers are in one of the two damping modes. It is assumed that amplifiers that are not in use are in a disabled state, such as FIG. 7G and not contributing to amplification (positive impedance) or damping or recovering power (negative impedance).

In amplification module 106 multiple amplifiers are utilized to generate the required signal. For example to generate a Loran pulse, a 15 amplifier configuration may be utilized. The amplifiers are switched to operating states sequentially to generate the pulse. To generate a specific wave form such as the Loran pulse the amplifiers would be switched in a predefined sequence such as:
8, 14, 15, 13, 9, 6, 3, 1, −1, −2, −2, −3, −3, −3, −3, −2, −2, −2, −2, −1, −1, −1, −1, −1 and −1
   In descriptive form the sequence is represented as:
   Pulse Trigger
   Enable 8 amplifiers driving positive phase then negative phase
   Enable 14 amplifiers driving positive phase then negative phase
   Enable 15 amplifiers driving positive phase then negative phase
   Enable 13 amplifiers driving positive phase then negative phase
   Enable 9 amplifiers driving positive phase then negative phase
   Enable 6 amplifiers driving positive phase then negative phase
   Enable 3 amplifiers driving positive phase then negative phase
   Enable 1 amplifier driving positive phase then negative phase
   Enable 1 amplifier passive damping for a full cycle
   Enable 2 amplifiers passive damping for a full cycle
   Enable 3 amplifiers passive damping for a full cycle
   Repeat 3 times
   Enable 2 amplifiers passive damping for a full cycle
   Repeat 3 times
   Enable 1 amplifier passive damping for a full cycle
   Repeat 5 times.

Note that this voltage envelope has been "sampled" once per full cycle interval i.e. the envelope sampling frequency is equal to the carrier frequency. However sampling at half cycle may be utilized to have finer control of the pulse shape. This would mean that the envelope sampling frequency is two times the carrier frequency.

This would change the sequence for the first 2 RF cycles of the above for example to:
   Pulse Trigger
   Enable 8 Amplifiers driving positive phase
   Enable 11 Amplifiers driving negative phase
   Enable 14 Amplifiers driving positive phase
   Enable 15 Amplifiers driving negative phase By switching the state of the amplifier and the number of amplifiers complex waveforms can be generated. The switching may occur in a predefined sequence or based upon the characteristics of an input signal.

Figure 8:
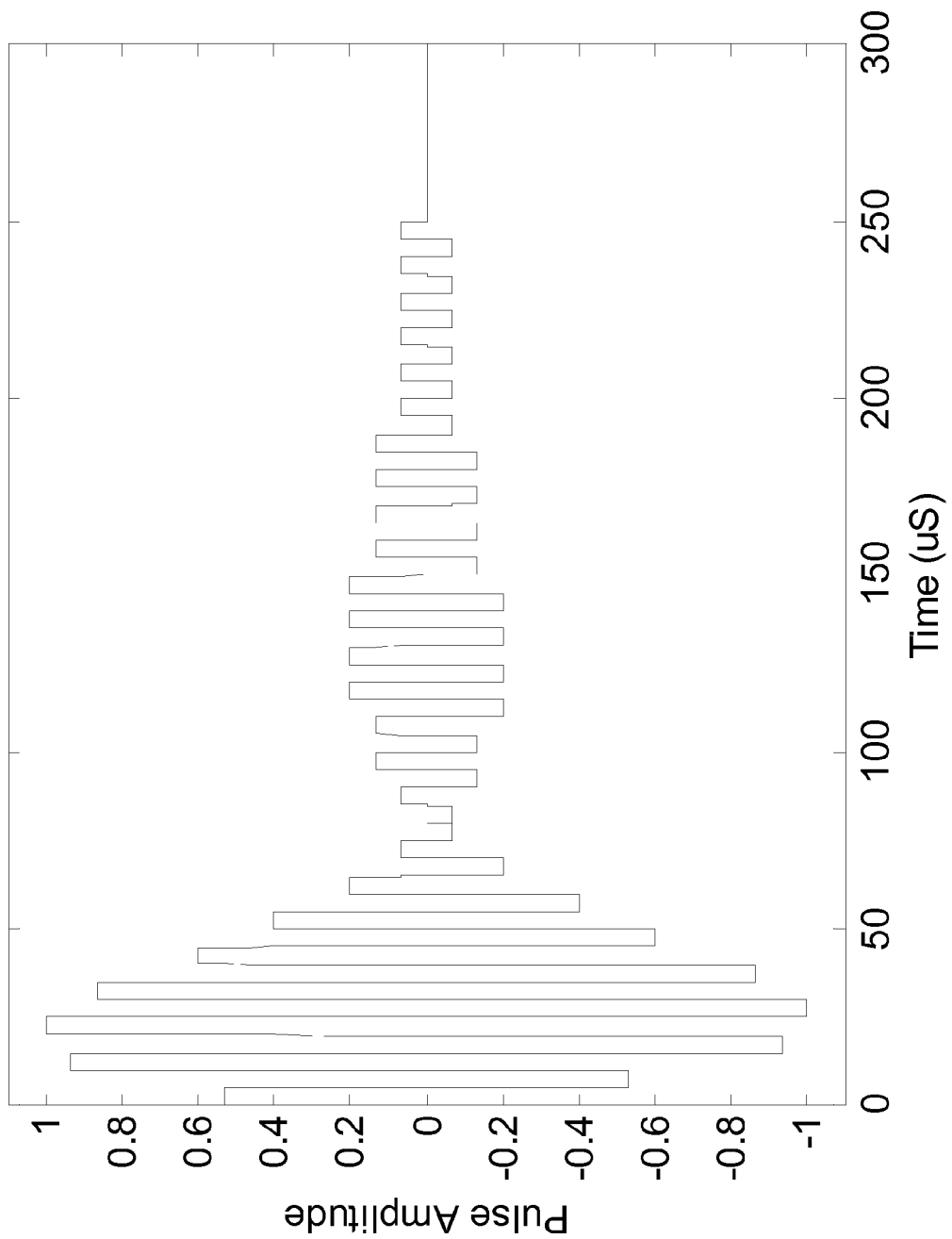
FIG. 8 is a graph representing combined amplifier output voltage waveform for Loran pulse.

A typical transmitter source voltage waveform (at the combiner output) is shown in FIG. 8. This particular sequence is matched to an antenna Q of 55. The number of amplifiers enabled on sequential RF cycles are 8, 14, 15, 13, 9, 6, 3, 1, −1, −2, −2, −3, −3, −3, −3, −2, −2, −2, −2, −1, −1, −1, −1, −1 and −1. In this sequence, positive numbers indicate the number of amplifiers sourcing power and negative numbers indicate the number of amplifiers recovering power. The remaining amplifiers would be disabled such as shown in FIG. 7G. The transmitter voltage may be modulated in the damping mode by switching amplifiers proportionately from the damping mode to disabled mode. The transmitter still has control of the output voltage waveform even when recovering power from the antenna as the output voltage will be proportional to the number of amplifiers in the damping mode on a given RF cycle.

It should be noted that the present disclosure can be carried out as a method, can be embodied in a system, a computer readable memory for controlling one or more amplifiers.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

What is claimed is:

1. An amplitude modulated amplifier for amplifying a radio frequency (RF) signal, the amplifier comprising:
    four selectably controllable transistors arranged to receive power from a direct current (DC) power supply to amplify the signal, the transistors configured in a bridge configuration with a first and a second transistor coupled between the DC power supply and an antenna having a short electrical length compared to a wavelength of a transmitted signal, and with a third and a fourth transistor coupled between the antenna and ground in an 'H' configuration, each transistor having a gate input to determine the state of the transistor between an on state and an off state;
    four diodes each associated with a different transistor of the four transistors and forward biased from a source to a drain of each transistor, forming a bridge rectifier; and
    drive logic for controlling each of the four transistors from an open state to a closed amplifying state based on external input, wherein the drive logic is selectable from a driving state to a damping state of the amplifier by switching transistors to recover power from the antenna when an impedance state of the antenna is negative, and to deliver the recovered power to the DC power supply.

2. The amplifier of claim 1 wherein the transistors are in a first driving state when the first and fourth transistors are on and the second and third transistors are off to provide current to the antenna in a positive phase of a voltage waveform through the transistors, and the transistors are in a second driving state when the second and third transistors are on and the first and fourth transistors are off to provide current to the antenna in a negative phase of a voltage waveform through the transistors.

3. The amplifier of claim 2 wherein the transistors are in a passive damping mode when the first, second, third and fourth transistors are off to enable current to flow in reverse from the antenna to the DC power source through the diodes associated with the transistors for the positive and negative phases of the voltage waveform.

4. The amplifier of claim 3 wherein the transistors are in a first active damping state when the first and fourth transistors are switched on and the second and third transistors are switched off when impedance at the antenna is negative to enable current to flow in reverse from the antenna to the DC power source through the transistor and diode associated with each transistor to provide current to the DC power source in the positive phase of the voltage waveform; and the transistors are in a second active damping state when the second and third transistors are switched on and the first and fourth transistors are switched off to enable current to flow in reverse from the antenna to the DC power source through the transistor and diode associated with each transistor to provide current to the DC power source in the negative phase of the voltage waveform; wherein each active damping state maintains phase control over the voltage waveform during damping.

5. The amplifier of claim 1 wherein each transistor has a low off state current when a large voltage is across a switch thereof to reduce off state losses and allow higher voltages to be used to increase power capability.

6. The amplifier of claim 1 wherein each transistor has a low device capacitance and inductance, and is adapted to change state quickly.

7. The amplifier of claim 1 wherein each transistor comprises an integral reverse diode having low voltage and resistance during reverse current flow as well as low current with off state voltage.

8. The amplifier of claim 1 wherein each transistor comprises a Metal Oxide Semiconductor Field Effect Transistor (MOSFET) device including a reverse body diode.

9. A system for transmitting radio frequency signals into an antenna having a short electrical length compared to a wavelength of a transmitted signal, the system comprising:
    a signal source providing a baseband source signal to be amplified and modulated before transmission;
    an exciter module for up-converting the source signal based on a frequency of a received RF source;
    an amplification module comprising one or more amplifiers, each amplifier comprising:
        four selectably controllable transistors arranged to receive power from a direct current (DC) power supply to amplify the up-converted source signal, the transistors configured in a bridge configuration with a first and a second transistor coupled between the DC power supply and an antenna, and a third and fourth transistors coupled between the antenna and ground in an 'H' configuration, each transistor having a gate input to determine the state of the transistor between an on state and an off state;
        four diodes each associated with a different transistor of the four transistors and forward biased from a source to a drain of each transistor, forming a bridge rectifier;
        drive logic for controlling each of the four transistors from an open state to a closed amplifying state based on external input, wherein the drive logic is selectable from an active state to a damping state of the amplifier by switching transistors to recover power from the antenna when an impedance state of the antenna is negative, and to deliver the recovered power to the DC power supply;
    a power source for delivering DC power to the amplification module or receiving and storing power from the amplification module;
    an antenna coupled to the amplification module, the antenna having a highly capacitive characteristic wherein the signal wavelength is less than the antenna wavelength, wherein current is delivered from the amplification module to the antenna when in the driving state and impedance is positive, and current is received from the antenna and delivered to the DC power source in the damping state when impedance is negative; and
    a controller coupled to or integrated with the exciter module, for controlling the operation of the one or more amplifiers via the drive logic, wherein a subset of the one or more amplifiers is switched between the driving state or damping state, wherein any remaining amplifier(s) of the one or more amplifiers are placed in an inactive mode, to control the modulation of the transmitted signal.

10. The system of claim 9 where the one or more amplifiers are switched between driving state, damping state, or inactive state in a predefined sequence on sequential RF cycles or half cycles to modulate the signal from the signal source to generate a Loran pulse.

* * * * *